(12) United States Patent
Sugiyama et al.

(10) Patent No.: US 10,001,693 B2
(45) Date of Patent: Jun. 19, 2018

(54) LIGHT COMMUNICATION DEVICE, LIGHT MODULE, AND METHOD FOR COUPLING

(71) Applicant: Fujitsu Optical Components Limited, Kawasaki-shi, Kanagawa (JP)

(72) Inventors: Masaki Sugiyama, Kawasaki (JP); Akira Ishii, Yokohama (JP); Norihisa Naganuma, Yokohama (JP); Eiichi Kodera, Yokohama (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 0 days. days.

(21) Appl. No.: 15/243,126

(22) Filed: Aug. 22, 2016

(65) Prior Publication Data

US 2017/0082906 A1    Mar. 23, 2017

(30) Foreign Application Priority Data

Sep. 17, 2015  (JP) ................................. 2015-183921

(51) Int. Cl.
    *G02F 1/035*    (2006.01)
    *G02F 1/225*    (2006.01)
    (Continued)

(52) U.S. Cl.
    CPC ............ *G02F 1/225* (2013.01); *G02F 1/2255* (2013.01); *G02F 2001/212* (2013.01); *H01S 5/0085* (2013.01); *H04B 10/516* (2013.01)

(58) Field of Classification Search
    CPC ....... G02F 1/2255; G02F 1/035; H05K 1/118; H05K 1/0219; H05K 3/363; H05K 3/366;
    (Continued)

(56) References Cited

U.S. PATENT DOCUMENTS 8,712,195 B2 *  4/2014  Sugiyama ............. G02F 1/0327
                                                    333/246
9,535,213 B2 *  1/2017  Sugiyama ................ G02B 6/12
(Continued)

FOREIGN PATENT DOCUMENTS

JP    59-189270    12/1984
JP    61-88262      6/1986
(Continued)

OTHER PUBLICATIONS

Japanese Office Action dated May 23, 2017, in corresponding Japanese Patent Application No. 2015-183921.

*Primary Examiner* — Thomas A Hollweg
*Assistant Examiner* — Guy Anderson
(74) *Attorney, Agent, or Firm* — Staas & Halsey LLP

(57) ABSTRACT

A light communication device further includes a rigid substrate, a package, and a flexible substrate. The rigid substrate includes a first terminal arranged on a surface thereof and a second terminal having a first hole opened at the surface. The package includes a third terminal and a fourth terminal being provided on a side wall thereof and being electrically coupled to a signal electrode and a ground electrode of the signal processor, respectively. The flexible substrate includes a fifth terminal and a sixth terminal being electrically coupled to the third terminal and the fourth terminal, respectively. The fifth terminal is electrically coupled to the first terminal on the surface, and the sixth terminal, with being placed into the first hole, is electrically coupled to the second terminal.

17 Claims, 22 Drawing Sheets

(51) Int. Cl.
    *H01S 5/00*     (2006.01)
    *H04B 10/516*   (2013.01)
    *G02F 1/21*     (2006.01)

(58) Field of Classification Search
    CPC ... H05K 2201/09172; H05K 2201/094; H05K 2201/09481; H05K 2201/09418; H05K 2201/0969
    See application file for complete search history.

(56) References Cited

U.S. PATENT DOCUMENTS

| | | | |
|---|---|---|---|
| 2010/0215324 A1 | 8/2010 | Ban | |
| 2010/0285676 A1 | 11/2010 | Ikeuchi et al. | |
| 2012/0051683 A1* | 3/2012 | Sugiyama | G02F 1/0327 385/1 |
| 2012/0114340 A1* | 5/2012 | Sugiyama | G02B 6/4201 398/200 |
| 2013/0027762 A1* | 1/2013 | Sugiyama | H05K 1/0215 359/245 |
| 2014/0085856 A1* | 3/2014 | Shirao | H05K 1/0251 361/803 |
| 2014/0119686 A1* | 5/2014 | Sugiyama | G02F 1/2255 385/2 |
| 2015/0156885 A1* | 6/2015 | Ono | H05K 1/117 361/749 |
| 2015/0253592 A1* | 9/2015 | Sugiyama | G02F 1/0121 385/40 |
| 2015/0253593 A1* | 9/2015 | Sugiyama | G02F 1/0121 385/40 |
| 2015/0261062 A1* | 9/2015 | Sugiyama | G02B 6/12 385/14 |
| 2016/0066425 A1* | 3/2016 | Iizaka | H05K 3/363 361/784 |

FOREIGN PATENT DOCUMENTS

| | | |
|---|---|---|
| JP | 4-48680 | 2/1992 |
| JP | 5-267811 | 10/1993 |
| JP | 2010-191346 | 9/2010 |
| JP | 2010-262871 | 11/2010 |
| JP | 2012-48121 | 3/2012 |

\* cited by examiner

FIG. 7
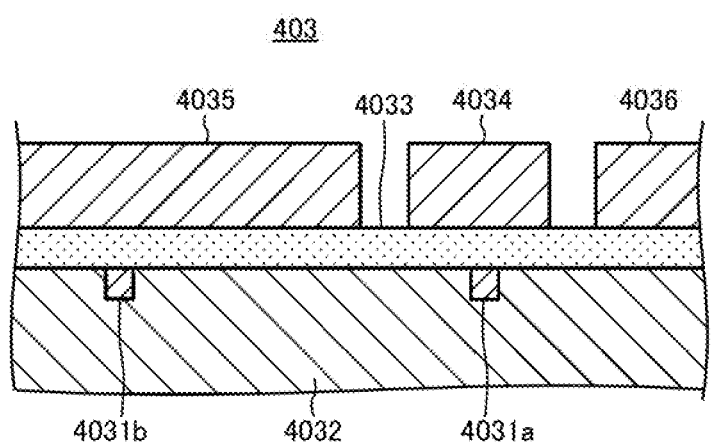
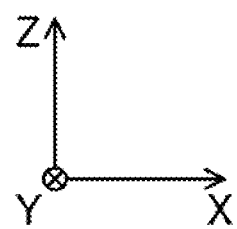

LIGHT COMMUNICATION DEVICE, LIGHT MODULE, AND METHOD FOR COUPLING

CROSS REFERENCE TO RELATED APPLICATION

This application is based upon and claims the benefit of priority of the prior Japanese Patent application No. 2015-183921, filed on Sep. 17, 2015, the entire contents of which are incorporated herein by reference.

FIELD

The embodiment discussed herein relates to a light communication device, a light module, and a method for coupling.

BACKGROUND

One of the light communication devices known to public includes a rigid substrate and a package accommodating a light modulator that modulates, based on a signal input from the rigid substrate, light (see, for example, Patent Literature 1). As illustrated in FIG. 1, a light communication device 90 includes a flexible substrate 95 that couples a first terminal 92 being provided on the surface of a rigid substrate 91 and a second terminal 94 protruding from a side wall of a package 93.

One end 96 of the flexible substrate 95 is coupled to the second terminal 94. A third terminal 98 is disposed on the surface of the other end 97 of the flexible substrate 95. The flexible substrate 95 is bent in such a posture that the third terminal 98 comes into contact with the first terminal 92 under a state where the third terminal 98 is positioned in parallel with the first terminal 92. Consequently, the third terminal 98 is coupled to the first terminal 92.

PRIOR ART REFERENCE

Patent Literature

[Patent Literature 1] Japanese Laid-open Patent Publication No. 2012-48121

SUMMARY

In the above light communication device 90, it is difficult to appropriately bend the flexible substrate 95 unless the first terminal 92 is arranged at a predetermined distance d from the package 93. This arrangement may sometimes excessively increase the area of a region used to couple a terminal of the package 93 and a terminal of the rigid substrate 91.

According to an aspect of the embodiment, a light communication device includes: a signal processor that transmits or receives a light signal and includes a signal electrode and a ground electrode. The light communication device further includes a rigid substrate, a package, and a flexible substrate. The rigid substrate includes a first terminal arranged on a surface thereof and a second terminal having a first hole opened at the surface. The package is disposed at the surface of the rigid substrate, contains the signal processor, and includes a third terminal and a fourth terminal being provided on a side wall thereof and being electrically coupled to the signal electrode and the ground electrode of the signal processor, respectively. The flexible substrate is arranged along the side wall such that a distal end thereof with respect to the rigid substrate is positioned near to the package and a proximal end thereof with respect to the rigid substrate is positioned near to the rigid substrate, and includes a fifth terminal and a sixth terminal being provided on the proximal end and being electrically coupled to the third terminal and the fourth terminal, respectively. The fifth terminal is electrically coupled to the first terminal on the surface, and the sixth terminal, with being placed into the first hole, is electrically coupled to the second terminal.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7 is a diagram illustrating an example of a cross section of a modulator of FIG. 6 cut by line C-C;

DESCRIPTION OF EMBODIMENTS

Figure 1:
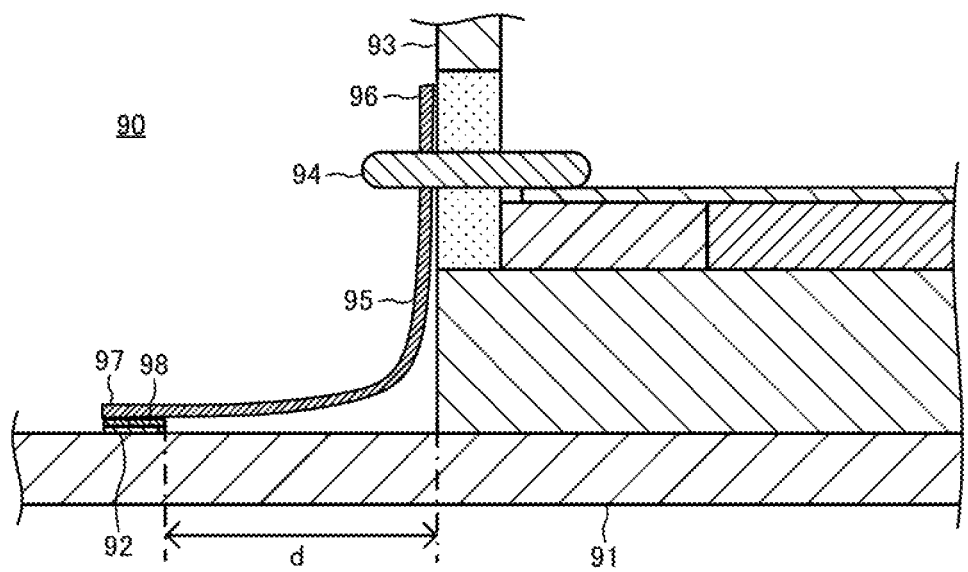
FIG. 1 is a diagram illustrating an example of coupling of a terminal of a package to a terminal of a rigid substrate.
Figure 2:
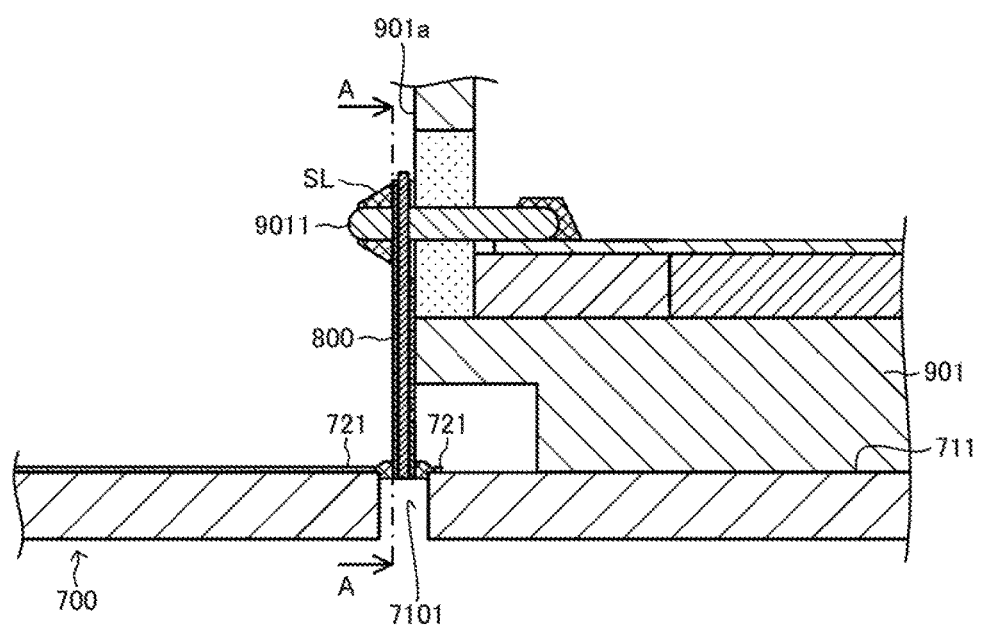
FIG. 2 is a diagram illustrating an example of coupling of a terminal of a package coupled to a signal electrode to a terminal of a rigid substrate.
Figure 3:
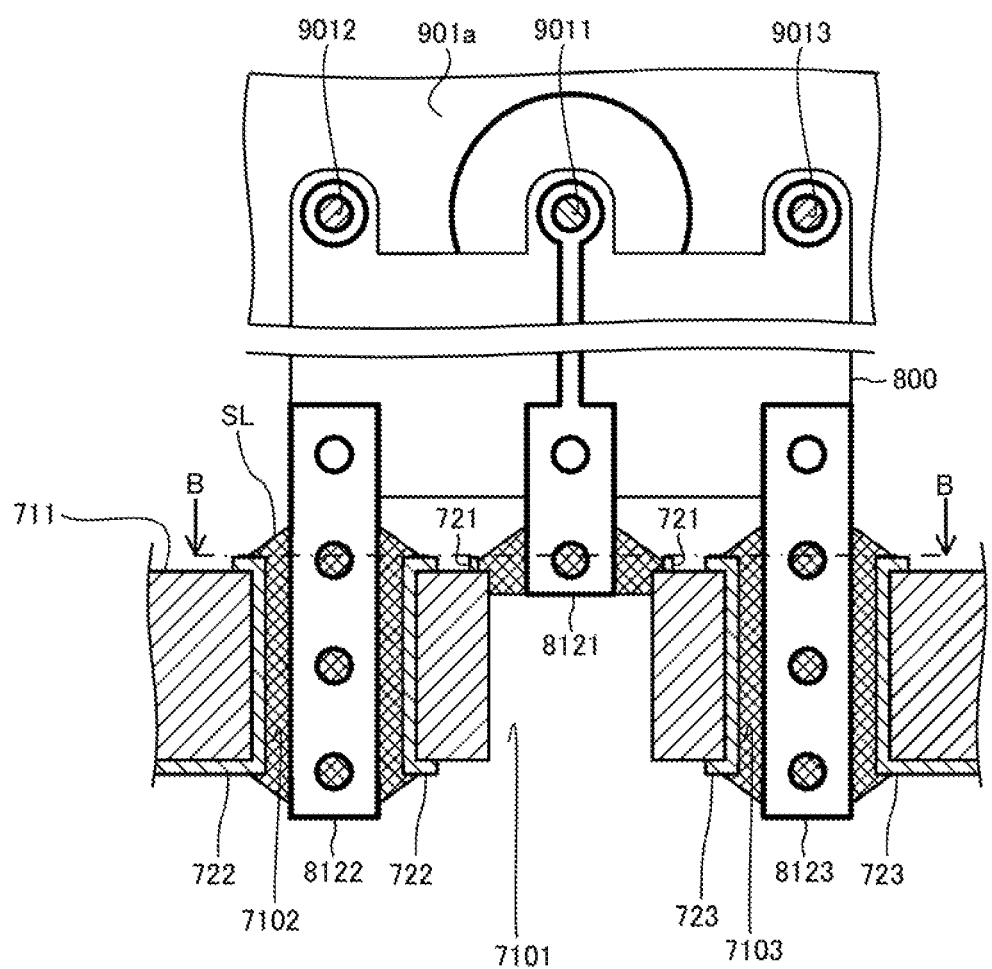
FIG. 3 is a diagram illustrating an example of a cross section of a transmitter of FIG. 2 cut by line A-A.
Figure 4:
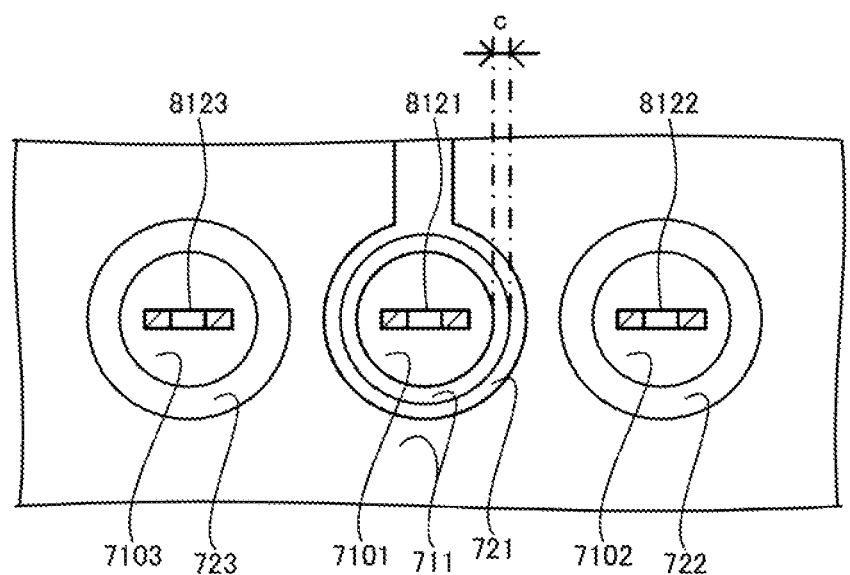
FIG. 4 is a diagram illustrating an example of a cross section of a transmitter of FIG. 3 cut by line B-B.

As illustrated in FIGS. 2-4, in a light communication device, terminals 8121 to 8123 of a flexible substrate 800 are coupled to terminals 721-723 of a rigid substrate 700, respectively, via through-holes 7101-7103 of the rigid substrate 700. FIG. 3 is a diagram illustrating an example of a cross section of the light communication device of FIG. 2 cut by line A-A; and FIG. 4 is a diagram illustrating an example of a cross section of the light communication device of FIG. 2 cut by line B-B.

As illustrated in FIGS. 2 and 3, a lead pin 9011 coupled to a signal electrode and protrusions 9012 and 9013 coupled to a ground electrode are disposed on side wall 901a of the package 901. One end of a flexible substrate 800 is electrically coupled to the lead pin 9011, the protrusions 9012 and 9013. At the other end of the flexible substrate 800, the terminals 8121-8123 are placed into the through-holes 7101-7103, respectively, and the terminals 8121-8123 are coupled to the through-holes 7101-7103, respectively, with soldering SL.

The capacitance between a terminal 721 coupled to a signal electrode and terminals 722 and 723 coupled to the ground electrode tends to be large. This may sometimes hinder the intrinsic impedance of the circuit of the rigid substrate 700 and the flexible substrate 800 from sufficiently approaching the target value (e.g., 50Ω), which results in that an RF signal is easily reflected to increase electric power loss caused from inputting a signal from the rigid substrate 700 into the package 901.

As a solution to the above, the area of the terminal 721 coupled to the signal electrode is formed only the surface 711 adjacent to the package 901 in the rigid substrate 700, so that the area of the terminal 721 coupled to the signal electrode is reduced. In this case, the manufacturing of the light communication device is assumed to include steps of: providing a conductor layer that is to serve a terminal having a round hole on the surface 711 of the rigid substrate 700; and forming, in the hole, a through-hole 7101 penetrating the rigid substrate 700 in the thickness direction with a cutting device such as a drill.

This structure needs to set the distance c between the through-hole 7101 and the terminal 721 to be wider than a predetermined margin distance for the protection of the terminal 721, which may result in excessively small area of the terminal 721, as illustrated in FIG. 4. An excessively small area tends to decrease the reliability of coupling between the terminal 8121 of the flexible substrate 800 and the terminal 721 of the rigid substrate 700.

This problem is solved by forming, on a rigid substrate, a first terminal arranged on the surface and a second terminal having a first hole opened to the surface. The package is formed on the above surface of the rigid substrate, contains the signal processor, and includes, on the side wall thereof, third and fourth terminals electrically coupled to the signal electrode and the ground electrode that the signal processor includes, respectively.

In addition to the above, the flexible substrate is arranged along the above side wall of the package so as to have a distal end and a proximal end with respect to the package, and has fifth and sixth terminals electrically coupled to the third and fourth terminals, respectively. The fifth terminal is further electrically coupled to the first terminal on the surface. The sixth terminal, with being placed into the first hole, is electrically coupled to the second terminal being placed into the first hole.

This configuration can electrically couple the terminal of the flexible substrate coupled to the ground electrode to the terminal of the rigid substrate, preventing the terminal of the flexible substrate from bending. This can shorten the distance between the terminal of the rigid substrate coupled to the ground electrode and the package in the direction perpendicular to a plane along the side wall, so that the rigid substrate may have a reduced area of a region to be used for coupling the package and a terminal of the rigid substrate. Consequently, it is possible to reduce the size of the light communication device.

Besides, the above structure makes capacitance between the terminal coupled to the signal electrode and the terminal coupled to the ground electrode possible to be smaller as compared with cases where the terminal being coupled to the signal electrode and being formed on the rigid substrate has a hole. Consequently, the intrinsic impedance of the circuit of the rigid substrate and the flexible substrate can sufficiently approach the target value (e.g., 50Ω), so that electric power loss caused from inputting a signal from the rigid substrate into the package can be suppressed.

This configuration can increase the area of a terminal that couples the fifth terminal to the first terminal as compared with cases where the terminal on the rigid substrate to be coupled to the signal electrode has a hole. In other words, this can increase the area of the terminal that soldering adheres to. Accordingly, it is possible to enhance the reliability of coupling of the fifth terminal to the first terminal.

Hereinafter, description will now be made in relation to an embodiment with reference to the drawings. The following embodiment is exemplary, so there is no intention to exclude application of various modifications and techniques not suggested in the following description to the embodiments. Throughout accompanying drawings of the embodiments, like reference numbers designate the same or substantially identical parts and elements unless changes and modification are specified.

First Embodiment (Configuration)

Figure 5:
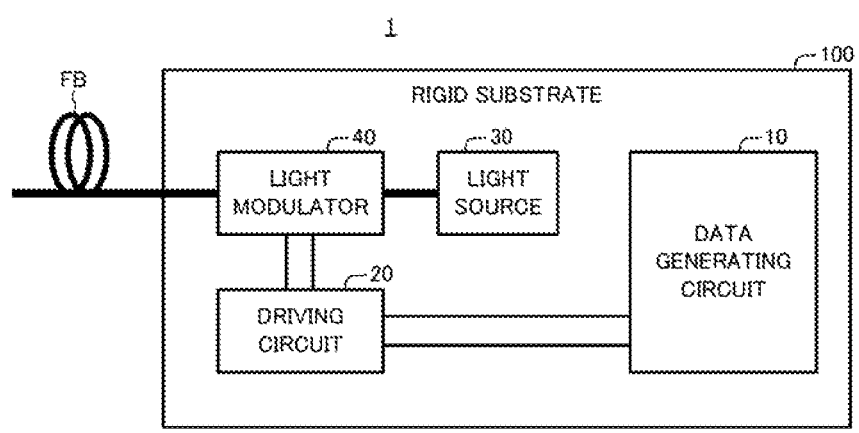
FIG. 5 is a block diagram illustrating an example of the configuration of a transmitter according to a first embodiment.

As illustrated in FIG. 5, a transmitter 1 of the first embodiment generates a light signal and transmits the generated light signal to a receiver. The transmitter 1 is an example of a light communication device. In this embodiment, the transmitter 1 includes a rigid substrate 100, which is an example of a first substrate and which takes a shape of a flat plate. The rigid substrate 100 includes a data generating circuit 10, a driving circuit 20, a light source 30, and a light modulator 40.

The data generating circuit 10 generates data and outputs the generated data to the driving circuit 20. The driving circuit 20 generates a driving signal to drive the light modulator 40 on the basis of the data input from the data generating circuit 10 and outputs the generated driving signal to the light modulator 40. The driving signal of this embodiment is a Radio Frequency (RF) signal.

The light source 30 generates light and outputs the generated light to the light modulator 40. Examples of the light source 30 are a semiconductor laser, such as a distributed feedback laser, and a laser diode.

The light modulator 40 modulates the light input from the light source 30 on the basis of the driving signal input from the driving circuit 20, and transmits the modulated light to the destination through a communication cable FB. The communication cable FB of this embodiment includes an optical fiber, which is exemplified by a Single Mode Fiber (SMF). The modulated light is an example of a light signal.

In this embodiment, the light modulator 40 is mounted on the rigid substrate 100. For example, as illustrated in FIG. 6, which depicts the cross section of the light modulator 40 cut along a plane parallel to the rigid substrate 100, the light modulator 40 includes a package 401, an input-end connector 402, a modulator 403, an output-end connector 404, a relay 405, and a terminal 406.

The package 401 is fixed to the rigid substrate 100. The package 401 contains the modulator 403, the relay 405, and the terminal 406. The package 401 of this embodiment takes the form of a cuboid. The package 401 may be referred to as a casing. The package 401 of this embodiment has side walls each forming a plane perpendicular to the rigid substrate 100. This means that the side walls of the package 401 are vertically arranged on the rigid substrate 100. The side walls of the package 401 may be referred to as the side faces of the package 401. The package 401 of this embodiment is made of a conductor (e.g., metal).

Figure 6:
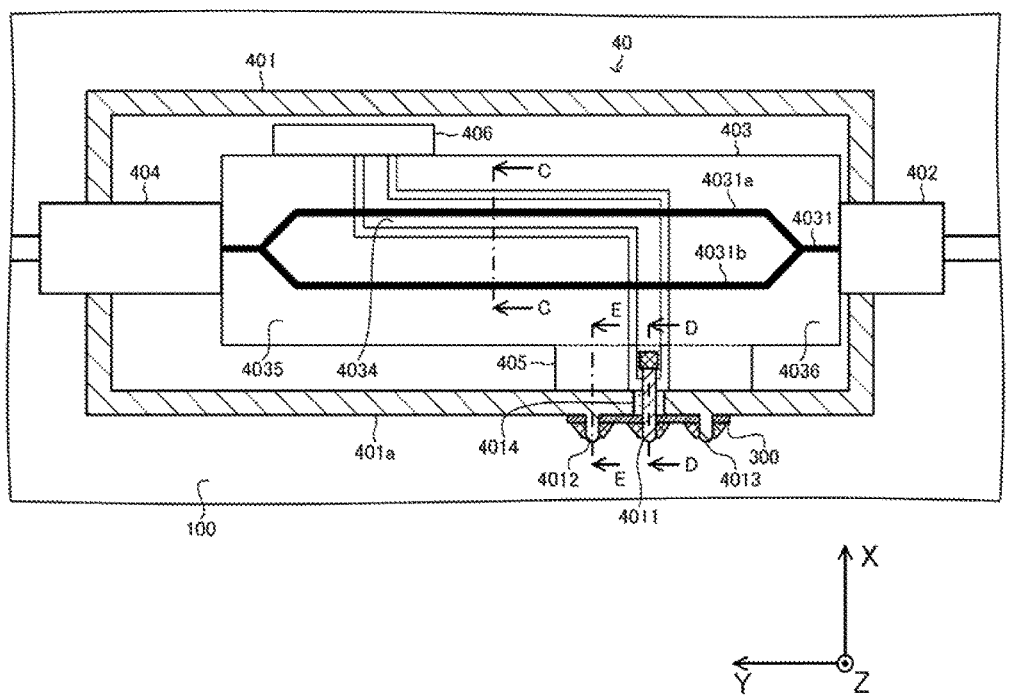
FIG. 6 is a diagram illustrating an example of a cross section of a light modulator of FIG. 5.

As illustrated in FIG. 6, the description of the transmitter 1 uses the right-handed orthogonal coordinate system having the X axis, the Y axis, and the Z axis. The Z axis extends along the direction perpendicular to the rigid substrate 100 (i.e., in the thickness direction of the rigid substrate 100). The positive Z-axis direction extends from the rigid substrate 100 to the package 401. The Y axis extends along the long side of the package 401 on the cross section of the light modulator 40 cut by a plane parallel to the rigid substrate 100. The X axis extends along the short side of the package 401 on the cross section of the light modulator 40 cut by a plane parallel to the rigid substrate 100. FIGS. 7-22 that are described below use the same right-handed orthogonal coordinate system as that in FIG. 6 in this example.

The input-end connector 402 receives the light output from the light source 30, and then outputs the received light to the modulator 403.

The modulator 403 modulates light using a Mach-Zehnder interferometer. In other words, the light modulator 40 is a Mach-Zehnder light modulator.

For example, as illustrated in FIGS. 6 and 7, the modulator 403 includes light waveguide 4031, a substrate 4032, a buffer layer 4033, a signal electrode 4034, and ground electrodes 4035 and 4036. FIG. 7 illustrates the cross section of the modulator 403 in FIG. 6 cut by line C-C.

The substrate 4032 has electric-optical crystal. For example, the material of the substrate 4032 contains $LiNbO_3$ or $LiTaO_2$ as a principal component.

The light waveguide 4031 may be formed by forming a metal layer of, for example, titanium (Ti) on a part of the substrate 4032 and then thermally diffusing the metal. The light waveguide 4031 may be formed by patterning followed by proton exchange in benzoic acid.

As illustrated in FIG. 6, the light waveguide 4031 branches into two light waveguides 4031a and 4031b parallel with each other in the vicinity of the input-end connector 402. The two light waveguides 4031a and 4031b join in the vicinity of the output-end connector 404.

As illustrated in FIG. 7, the buffer layer 4033 is in contact with a face on the positive side of the substrate 4032 in the direction of the Z axis. In this embodiment, the buffer layer 4033 is formed of an insulator, such as $SiO_2$. The buffer layer 4033 has a length (i.e., the thickness) along the Z axis of, for example, 0.2 μm to 2 μm. The presence of the buffer layer 4033 makes it possible to inhibit the electrodes 4034-4036 from absorbing the light propagating through the light waveguide 4031.

As illustrated in FIG. 7, the electrodes 4034-4036 are in contact with a face on the positive side of the buffer layer 4033 in the direction of the Z axis. The signal electrode 4034 is mainly positioned in the region covering a straight line passing through the light waveguide 4031a and extending along the Z axis.

As illustrated in FIGS. 6 and 7, the ground electrodes 4035 and 4036 are positioned so as to sandwich the signal electrode 4034 at a predetermined distance on the plane (i.e., XY plane) perpendicular to the Z axis. Accordingly, the electrodes 4034-4036 can be regarded as a coplanar transmission path. As illustrated in FIG. 7, the ground electrodes 4035 and 4036 are mainly positioned in the region covering a straight line passing through the light waveguide 4031b and extending along the Z axis.

Into the signal electrode 4034, a driving signal from the driving circuit 20 is input, as to be detailed below.

The terminal 406 terminates the driving signal input into the signal electrode 4034. In this embodiment, the terminal 406 couples the signal electrode 4034 to the ground electrodes 4035 and 4036 via a resistor.

With this configuration, the modulator 403 changes the difference of the phases of light propagating through the light waveguide 4031a and the light waveguide 4031b on the basis of the input driving signal. The modulator 403 generates a light signal having a modulated intensity.

The modulator 403 outputs the modulated light signal to the output-end connector 404. The modulator 403 is an example of a signal processor that carries out a transmission process on a light signal.

The output-end connector 404 transmits the light signal input from the modulator 403 to the destination through the communication cable FB.

The relay 405 is positioned between the modulator 403 and the package 401. The electrodes 4034-4036 extend from the modulator 403 to the relay 405 on the positive side of the face of the relay 405 in the direction of the Z axis. The ground electrodes 4035 and 4036 are electrically coupled to the package 401.

Figure 8:
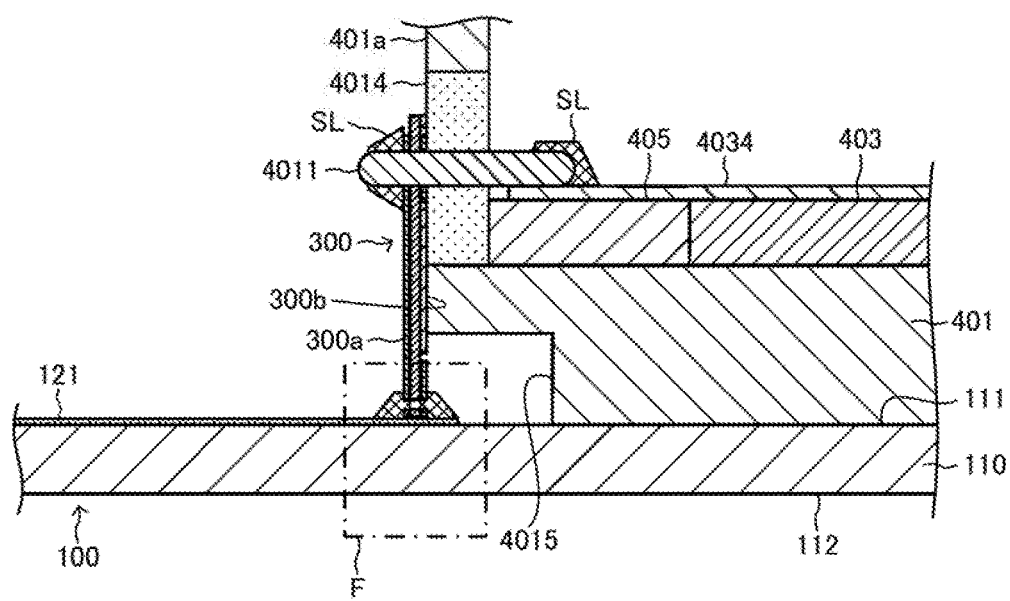
FIG. 8 is a diagram illustrating an example of a cross section of a transmitter of FIG. 6 cut by line D-D.

As illustrated in FIGS. 6 and 8, the package 401 includes a lead pin 4011. The signal electrode 4034 is electrically coupled to the lead pin 4011 with soldering SL. FIG. 8 depicts the cross section of the transmitter 1 cut by the D-D line of FIG. 6. The lead pin 4011 is an example of a third terminal.

As illustrated in FIGS. 6 and 8, the light modulator 40 has a window 4014 on a side wall 401a on the negative side of the package 401 in the direction of the X axis. The window 4014 is formed of an insulator, such as glass. The lead pin 4011 penetrates the window 4014 to externally project from the package 401.

Figure 9:
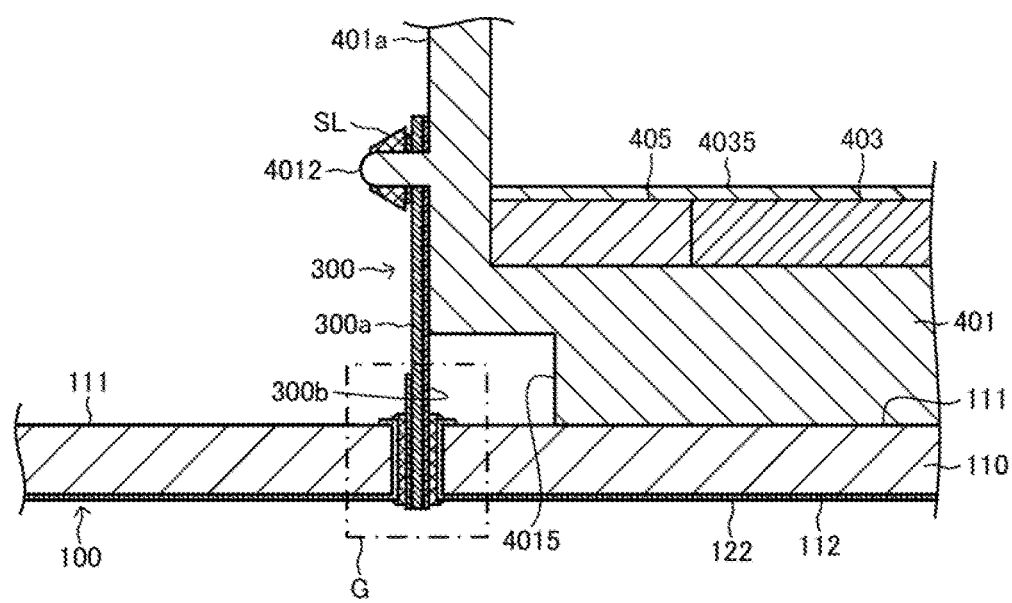
FIG. 9 is a diagram illustrating an example of a cross section of a transmitter of FIG. 6 cut by line E-E.

As illustrated in FIGS. 6 and 9, the side wall 401a on the negative side of the package 401 in the direction of the X axis includes two protrusions 4012 and 4013. FIG. 9 is a cross section of the transmitter 1 cut by line E-E of FIG. 6. The two protrusions 4012 and 4013 are each an example of the fourth terminal. The protrusion 4013, the lead pin 4011, and the protrusion 4012 are arranged in this sequence in the positive direction of the Y axis along the Y axis. The protrusion 4013, the lead pin 4011, and the protrusion 4012 are arranged at equal intervals along the Y axis.

As illustrated in FIGS. 6, 8, and 9, the transmitter 1 includes a flexible substrate 300 that electrically couples the modulator 403 accommodated in the package 401 to the rigid substrate 100. The flexible substrate 300 is an example of a second substrate. The flexible substrate 300 takes a form of a flexible sheet. The flexible substrate 300 may also be referred to as a Flexible Printed Circuit (FPC).

Figure 10:
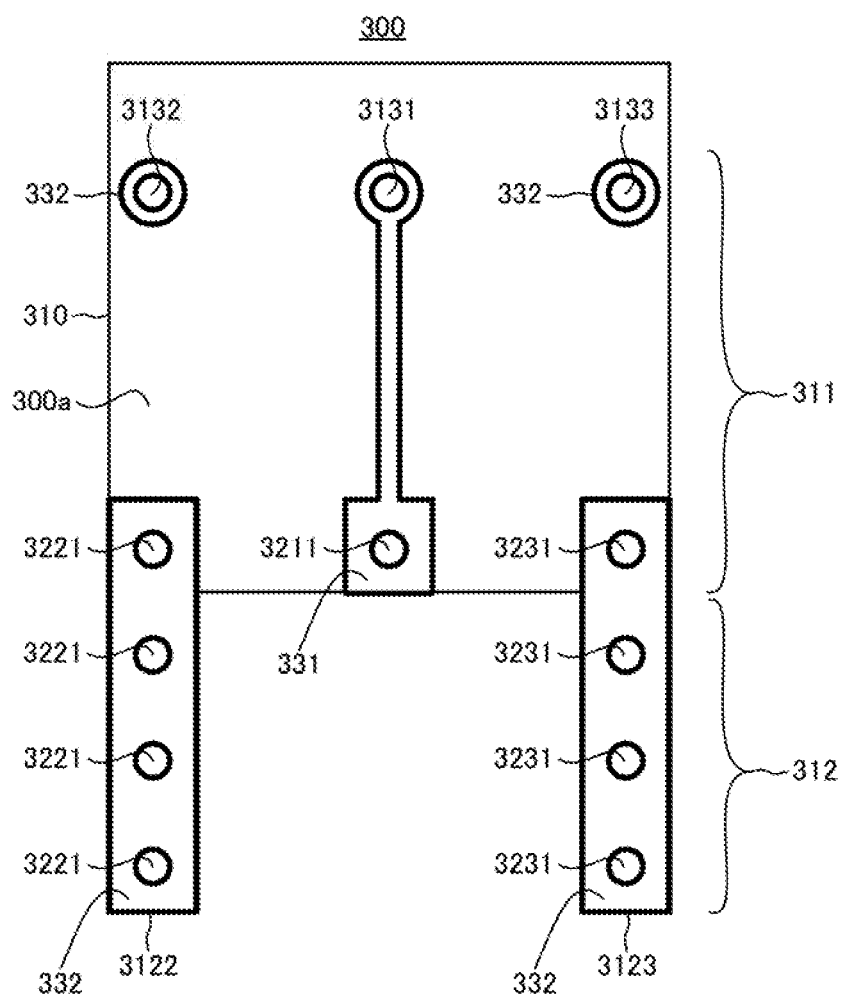
FIG. 10 is a diagram illustrating an example of a front view of a flexible substrate of FIGS. 8 and 9.
Figure 11:
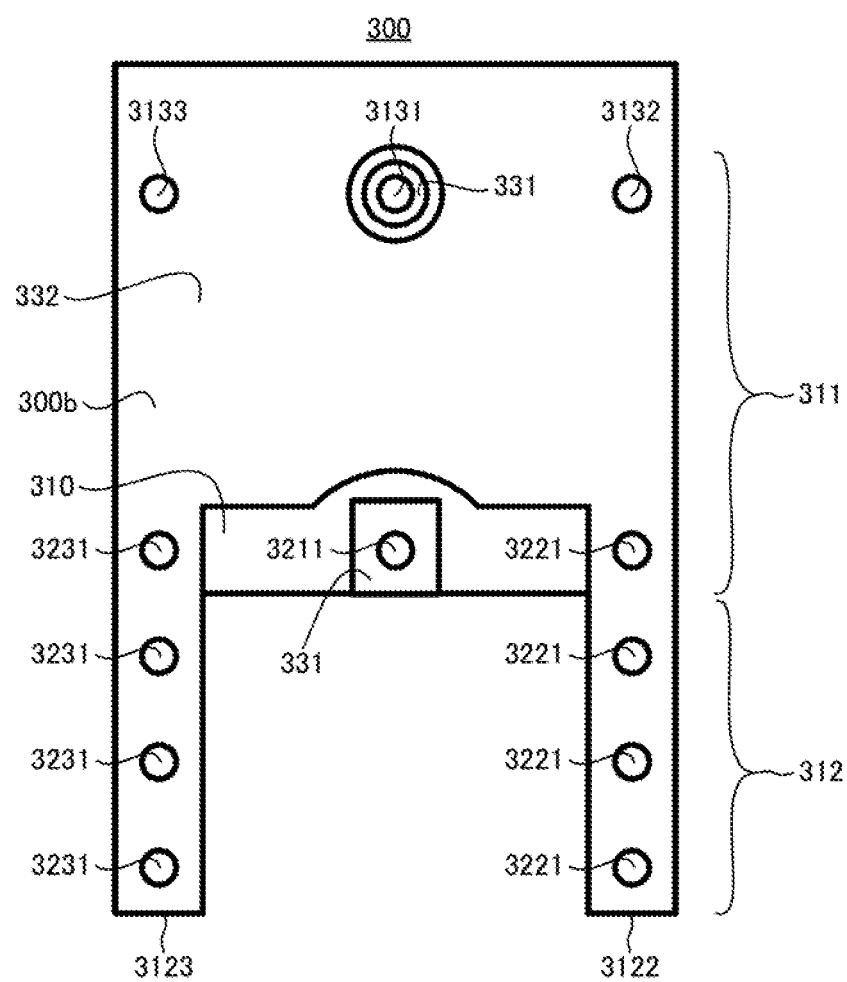
FIG. 11 is a diagram illustrating an example of a back view of a flexible substrate of FIGS. 8 and 9.

For example, as illustrated in FIGS. 10 and 11, the flexible substrate 300 includes a body 310 and conductor layers 331 and 332 each partially covering the surface of the body 310. In this embodiment, the body 310 is formed of an insulator. The conductor layer 331 is an example of a fifth terminal and the conductor layer 332 is an example of a sixth terminal.

FIG. 10 illustrates the flexible substrate 300 when the transmitter 1 is seen in the positive direction of the X axis; and FIG. 11 illustrates the flexible substrate 300 when the transmitter 1 is seen in the negative direction of the X axis.

The flexible substrate 300 is arranged along the side wall 401a such that a distal end (on the positive end in the direction of the Z axis) of the flexible substrate 300 is positioned in the vicinity of the package 401 and a proximal end (on the negative end in the direction of the Z axis) of the flexible substrate 300 is positioned in the vicinity of the rigid substrate 100.

The body 310 includes a rectangular base 311 and a protrusion group 312 extending from the side on the negative end of the Z axis of the base 311 in the negative direction of the Z axis. In other words, the protrusion group 312 forms the tips of the body 310 on the negative end of the Z axis. The protrusion group 312 includes two protrusions 3122 and 3123. The protrusions 3122 and 3123 are positioned on the both ends along the direction of the Y axis.

The two protrusions 3122 and 3123 of this embodiment have the same length along the Y axis. The length of the protrusions 3122 and 3123 along the Y axis is shorter than the length of the side on the negative end of the base 311 in the direction of the Z axis along the Y axis. This means that the protrusions 3122 and 3123 extend from a part of the side on the negative end of the base 311 in the direction of the Z axis.

Furthermore, the protrusions 3122 and 3123 have the same length along the Z axis in this embodiment.

The base 311 includes a through-hole 3131 at the center position along the Y axis on the positive end of the Z axis, and further includes through-holes 3132 and 3133 on the straight lines passing through the protrusions 3122 and 3123 and also being parallel to the Z axis at the positive end of the Z axis. The through-holes 3133, 3131, and 3132 are positioned in this order on the straight line along the Y axis towards the positive direction of the Y axis. The through-holes 3133, 3131, and 3132 are arranged at equal intervals along the direction of the Y axis.

The base 311 includes a through-hole 3211 at the center position along the Y axis on the negative end of the Z axis, and further includes through-holes 3132 and 3133 on the straight line passing through the protrusions 3221 and 3231 and also being parallel to the Z axis at the negative end in the direction of the Z axis.

The protrusion 3122 includes multiple through-holes 3221 and the protrusion 3123 includes multiple through-holes 3231. The through-holes 3221 are arranged at equal intervals along the direction of the Z axis and the through-holes 3231 are also arranged at equal intervals along the direction of the Z axis.

As illustrated in FIG. 10, the conductor layer 331 is positioned in the vicinity of the through-hole 3211 of the base 311 and of the through-hole 3131 of the base 311 on a surface 300a on the negative side of the flexible substrate 300 in the direction of the X axis. Furthermore, the conductor layer 331 is positioned in a region near the terminal 3211 of the base 311 and a portion near the through-hole 3131 of the base 311 on the surface 300a on the negative side of the flexible substrate 300 in the direction of the X axis.

As illustrated in FIG. 11, the conductor layer 331 is positioned in the vicinity of the through-hole 3131 of the base 311 and of the through-hole 3211 of the base 311 on the surface 300b on the positive side of the flexible substrate 300 in the direction of the X axis. Furthermore, the conductor layer 331 is positioned on a wall of the body 310 having the through-hole 3131. In addition, the conductive layer 331 is positioned on the wall of the body 310 having the through-hole 3211.

As illustrated in FIG. 10, the conductor layer 332 is positioned on the protrusion 3122 and also on a portion of the base 311 in the vicinity of the through-hole 3221 and a portion of the base 311 in the vicinity of the through-hole 3132 on the surface 300a on the negative side of the flexible substrate 300 in the direction of the X axis. Furthermore, the conductor layer 332 is positioned on the protrusion 3123, a portion of the base 311 in the vicinity of the through-hole 3231, and a portion of the base 311 in the vicinity of the through-hole 3133 on the surface 300a on the negative side of the flexible substrate 300 in the direction of the X axis.

As illustrated in FIG. 11, the conductor layer 332 is positioned on the protrusion 3122 and also a portion of the base 311 in the vicinity of the through-holes 3221 and a portion of the base 311 in the vicinity of the through-hole 3132 on the surface 300b on the positive side of the flexible substrate 300 in the direction of the X axis. Further, the conductor layer 332 is positioned on the protrusion 3123, a portion of the base 311 in the vicinity of the through-hole 3231, and a portion of the base 311 in the vicinity of the through-hole 3133 on the surface 300b on the positive side of the flexible substrate 300 in the direction of the X axis.

In addition, the conductor layer 332 is positioned on a region connecting the terminal 3122, a portion of the base 311 in the vicinity of the terminal 3132, the terminal 3123, and a portion of the base 311 in the vicinity of the terminal 3133 on the surface 300b on the positive side of the flexible substrate 300 in the direction of the X axis.

Furthermore, the conductor layer 332 is positioned on a wall of the body 310 which wall has the through-holes 3221, 3231, 3132, and 3133.

In this embodiment, the conductor layer 332 is out of contact with the conductor layer 331.

As illustrated in FIGS. 8 and 9, the side wall 401a of the package 401 has a recess 4015 at the negative end in the direction of the Z axis. The recess 4015 is positioned on a region including a straight line that passes through the protrusion 4013, the lead pin 4011, and the protrusion 4012 and that extends in the direction of the Z axis.

Figure 12:
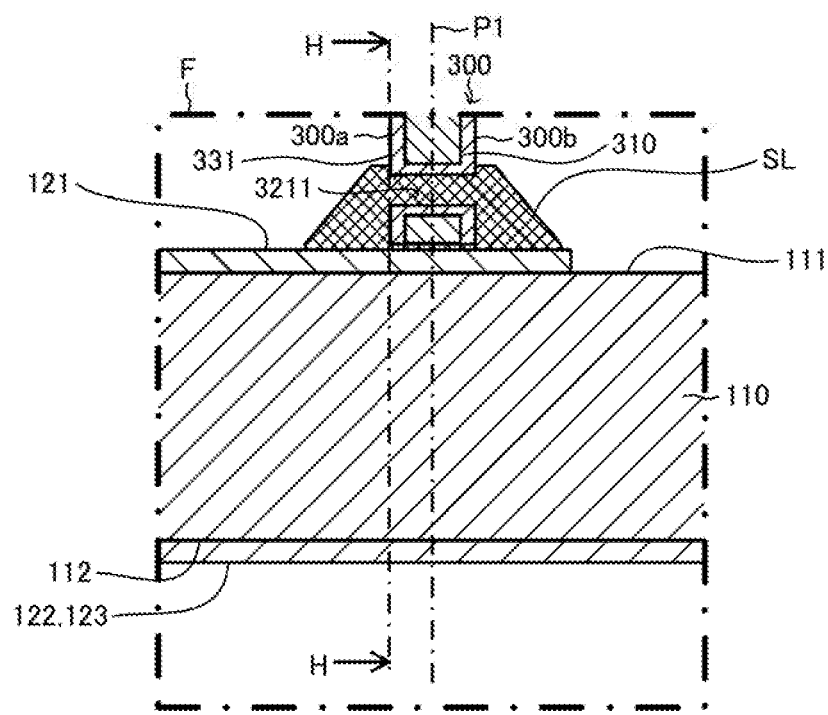
FIG. 12 is an enlargement view of the region F of FIG. 8.
Figure 13:
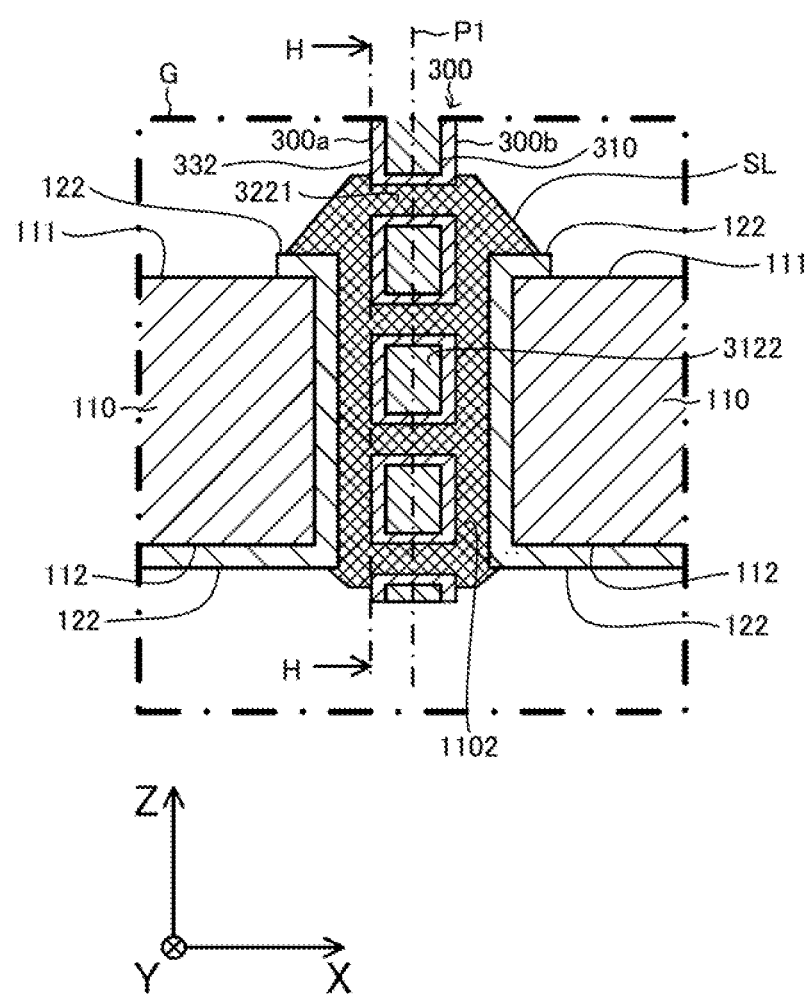
FIG. 13 is an enlargement view of the region G of FIG. 9.
Figure 14:
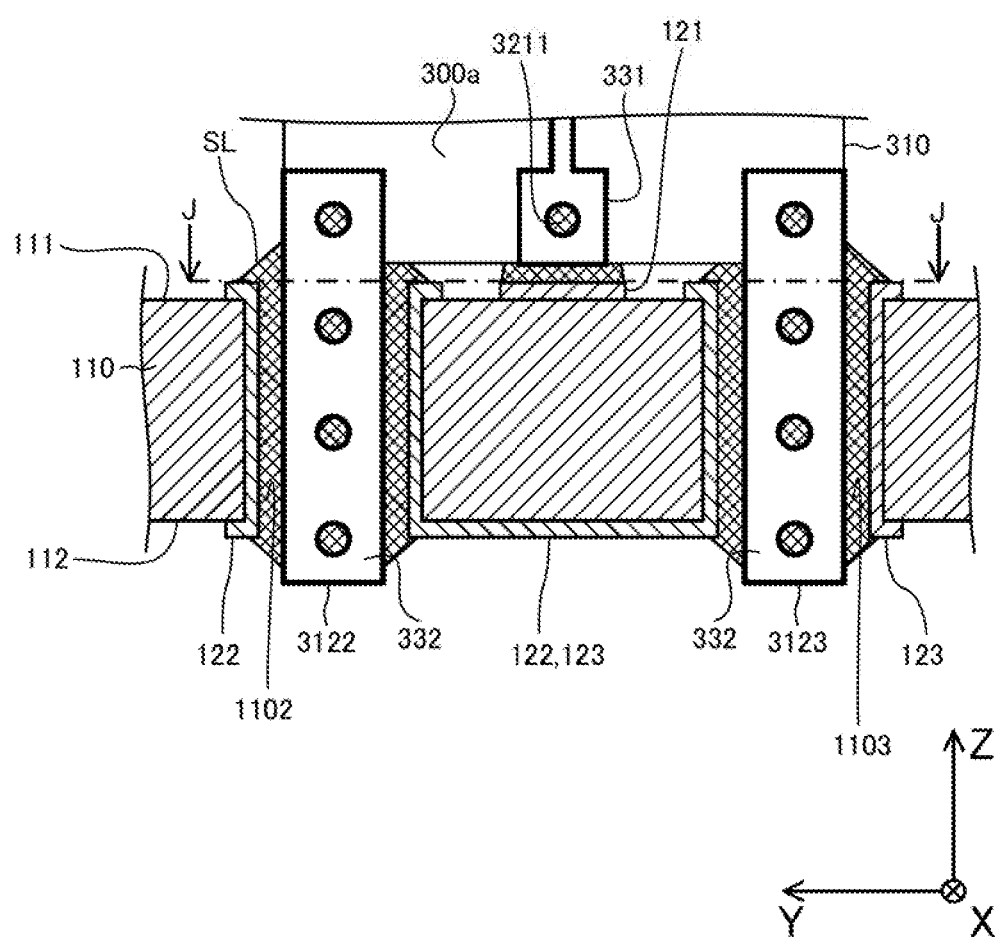
FIG. 14 is a diagram illustrating an example of a cross section of a transmitter of FIGS. 12 and 13 cut by line H-H.
Figure 15:
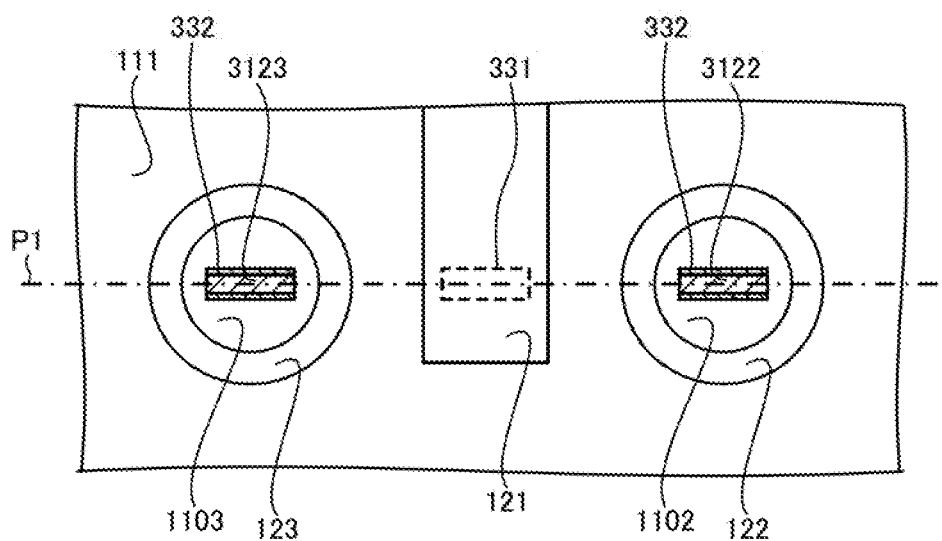
FIG. 15 is a diagram illustrating an example of a cross section of a transmitter of FIG. 14 cut by line J-J.

As illustrated in FIGS. 8, 9, 12 and 15, the rigid substrate 100 includes a body 110, the conductor layers 121-123 each partially covering the part of the surface of the body 110. The rigid substrate 100 further has through-holes 1102 and 1103. FIG. 12 is an enlarged view of the region F of FIG. 8. FIG. 13 is an enlarged view of the region G of FIG. 9. FIG. 14 is a cross section of the transmitter 1 cut along the line H-H of FIGS. 12, 13, and 15 is a cross section of the transmitter 1 cut along the line J-J of FIG. 14. FIG. 15 omits an illustration of soldering.

The conductor layer 121 is an example of the first terminal. The through-holes 1102 and 1103 are each an example of the first through-hole or the first hole. The conductor layers 122 and 123 are each an example of the second terminal, which may be referred to as a second through-hole terminal.

As illustrated in FIGS. 12, 14, and 15, the conductor layer 121 is positioned in a region including a position on a straight line passing through the position of the lead pin 4011 on the plane P1 extending along the side wall 401a of the package 401 and being parallel with the Z axis on the surface 111 on the positive side of the body 110 in the direction of the Z axis. In other words, the conductor layer 121 is disposed on the surface 111 on the positive side of the body 110 in the direction of the Z axis.

As illustrated in FIG. 15, the conductor layer 121 of the first embodiment has a predetermined width on the surface 111 on the positive side of the body 110 in the direction of the Z axis, and extends, in the negative direction of the X axis, from a position near a point on the plane P1 extending along the side wall 401a of the package 401. In other words, the conductor layer 121 extends, on the surface 111 on the positive side of the body 110 in the direction of the Z axis, along the direction perpendicular to the plane P1 extending along the side wall 401a of the package 401.

As illustrated in FIGS. 14 and 15, the conductor layer 121 of this embodiment has a width longer by a predetermined margin value than the Y-direction length of the conductor layer 331 positioned at the negative end of the base 311 in the direction of the Z axis.

As illustrated in FIG. 8, the lead pin 4011, being in a state of penetrating the flexible substrate 300 through the through-hole 3131, is electrically coupled to the conductor layer 331 with soldering SL.

As illustrated in FIGS. 12, 14, and 15, the conductor layer 331 of the flexible substrate 300, being in a state where the negative end of the conductor layer 331 in the direction of the Z axis is positioned a point towards the positive side in the direction of the Z axis from the conductor layer 121 of the rigid substrate 100, is electrically coupled to the conductor layer 121 by the soldering SL. In other words, the negative end of the conductor layer 331 in the direction of the Z axis is positioned a point towards the package 401 from the rigid substrate 100 in the direction of the perpendicular to the rigid substrate 100.

The conductor layer 331 of the flexible substrate 300 may be electrically coupled to the conductor layer 121 with soldering SL under a state where the negative end of the conductive layer 331 in the direction of the Z axis is in contact with the conductor layer 121 of the rigid substrate 100.

In this embodiment, the conductor layer 331 is electrically coupled to the conductor layer 121 with soldering SL filling the through-hole 3211 and also covering at least part of the conductor layer 331 outside the through-hole 3211. In other words, the conductor layer 331 is electrically coupled to the conductor layer 121 when the through-hole 3211 is embedded in soldering SL.

As illustrated in FIGS. 13 and 15, the through-holes 1102 and 1103 each take a form of a column. The through-holes 1102 and 1103 each have a central axis positioned on a plane P1 extending along the side wall 401a of the package 401. The through-holes 1102 and 1103 are positioned in regions including straight lines passing through the protrusions 4012 and 4013, respectively, and extending in the direction of the Z axis.

In this embodiment, as illustrated in FIG. 15, the through-holes 1102 and 1103 have the same diameter. The diameters of the through-holes 1102 and 1103 are longer by a predetermined margin than the length of the respective protrusions 3122 and 3123 in the direction of the Y axis.

As illustrated in FIGS. 14 and 15, the conductor layers 122 and 123 are positioned in the vicinity of the through-holes 1102 and 1103, respectively, on the surface 111 on the positive side of the body 110 in the direction of the Z axis. In this embodiment, the conductor layers 122 and 123 have the predetermined widths and form the outer circumferences of the through-holes 1102 and 1103, respectively, on the surface 111 on the positive side of the body 110 in the direction of the Z axis. The conductor layers 122 and 123 may also be referred to as lands.

In this embodiment, the conductor layers 122 and 123 have the same width.

As illustrated in FIG. 13, the conductor layers 122 and 123 are positioned in the vicinity of the through-holes 1102 and 1103, respectively, on the surface 112 on the negative side of the body 110 in the direction of the Z axis. In this embodiment, the conductor layers 122 and 123 have the above width on the surface 112 on the negative side of the body 110 in the direction of the Z axis and form the outer circumferences of the through-holes 1102 and 1103, respectively.

As illustrated in FIG. 14, the conductor layers 122 and 123 are positioned on the wall of the body 110 that forms the through-holes 1102 and 1103.

This means that the conductor layers 122 and 123 form the through-holes 1102 and 1103 each having an opening on the surface 111 on the positive side of the body 110 in the direction of the Z axis, respectively. In other words, the conductor layers 122 and 123 have the through-holes 1102 and 1103 opened to the surface 111 on the positive side of the body 110 in the direction of the Z axis, respectively.

As illustrated in FIG. 9, the protrusions 4012 and 4013, being in a state of penetrating the flexible substrate 300 through the through-holes 3132 and 3133, respectively, are electrically coupled to the conductor layer 331 with soldering SL.

As illustrated in FIGS. 13 and 14, the conductor layer 332 of the flexible substrate 300 is electrically coupled to the conductor layers 122 and 123 with soldering SL under a state where the protrusions 3122 and 3123 penetrates the rigid substrate 100 through the through-holes 1102 and 1103, respectively. Accordingly, the through-holes 1102 and the 1103 of this embodiment accommodate some of the protrusions 3122 and 3123, respectively, on the plane P1 extending along the side wall 401a of the package 401.

The combination rigid substrate 100, the package 401, and the flexible substrate 300 is an example of a light module.

Here, description will now be made in relation to a method for installing the flexible substrate 300 involved in a method of manufacturing of the transmitter 1.

For example, the method for installing the transmitter 1 may include the following steps 1) to 6) to be carried out in this sequence.

1) The package 401 is fixed to the rigid substrate 100.
2) The flexible substrate 300 is moved with respect to the package 401 such that the lead pin 4011, the protrusion 4012, and the protrusion 4013 penetrate the through-holes 3131-3133, respectively.
3) In a state where the surface 300b on the positive side of the flexible substrate 300 in the direction of the X axis is in contact with the side wall 401a, the lead pin 4011, the protrusion 4012, and the protrusion 4013 are electrically coupled to the conductor layers 331 and 332 of the flexible substrate 300 with soldering SL.
4) The protrusions 3122 and 3123 of the flexible substrate 300 are inserted into the through-holes 1102 and 1103, respectively.

5) The protrusions 3122 and 3123 of the flexible substrate 300 are electrically coupled to the conductor layers 122 and 123 of the rigid substrate 100 with soldering SL.

6) The through-hole 3211 of the conductor layer 331 of the flexible substrate 300 is embedded in soldering SL by attaching the soldering SL to the conductor layer 331 and the conductor layer 121 of the rigid substrate 100. Consequently, the conductor layer 331 is electrically coupled to the conductor layer 121 on the surface 111 of the rigid substrate 100 with soldering SL.

The steps 1) to 6) may be carried out in a different order from the above. However, the step 3) needs to be carried out after the step 2) and the step 5) needs to be carried out after the step 4).

(Operation)

Description will now be made in relation to operation of the transmitter 1.

The data generating circuit 10 generates data and outputs the generated data to the driving circuit 20. The driving circuit 20 generates a driving signal to drive the light modulator 40 on the basis of the data input from the data generating circuit 10. The driving circuit 20 outputs the generated driving signal to the light modulator 40 through the flexible substrate 300.

The light source 30 generates light and outputs the generated light to the light modulator 40. The light modulator 40 modulates the light input from the light source 30 on the basis of the driving signal input from the driving circuit 20, and transmits the modulated light to the receiver through the communication cable FB.

As described above, in the transmitter 1 of the first embodiment, the conductor layer 331 of the flexible substrate 300 is electrically coupled to the conductor layer 121 on the surface 111 of the rigid substrate 100. Furthermore, in the flexible substrate 300, the conductor layer 332 is electrically coupled to the conductor layers 122 and 123 by placing the protrusions 3122 and 3123 into the through-holes 1102 and 1103, respectively.

This configuration allows the flexible substrate 300, being in a state where the protrusions 3122 and 3123 do not bent, to electrically couple the conductor layer 332 coupled to the ground electrode 4035 to the conductor layers 122 and 123 of the rigid substrate 100. Since this shortens the distance between the terminal (in this example, conductor layers 122 and 123) of the rigid substrate 100 coupled to the ground electrode 4035 and the package 401 along the direction of the X axis, the area on the rigid substrate 100 used for coupling the package 401 to the conductor layers 122 and 123 of the rigid substrate 100 can be reduced, which can achieve a compact transmitter 1, for example.

As compared with cases where a through-hole is provided on a terminal of the rigid substrate coupled to the signal electrode and also the wall forming the through-hole is covered with a conductor layer, the above configuration makes capacitance between the conductor layer 331 and the conductor layers 332, 122, and 123 coupled to the ground electrodes 4035 and 4036 possible to be smaller. Consequently, the intrinsic impedance of the circuit of the rigid substrate 100 and the flexible substrate 300 can sufficiently approach the target value (e.g., 50Ω), so that electric power loss caused from inputting a signal from the rigid substrate 100 into the package 401 can be suppressed.

In addition, as compared with cases where a through-hole is provided on a terminal of the rigid substrate coupled to the signal electrode, the area for coupling the conductor layer 331 to the conductor layer 121 can be increased. This means that the area that the soldering SL adheres to can be increased, so that the reliability of coupling of the conductor layer 331 to the conductor layer 121 can be enhanced.

Furthermore, in the transmitter 1 of the first embodiment, soldering SL fills the through-hole 3211 and covers at least part of the conductor layer 331 outside the through-hole 3211. This configuration allows the conductor layer 331 to be electrically coupled to the conductor layer 121 on the surface 111.

Accordingly, the soldering SL can prevent the conductive layer 331 from peeling off from the conductor layer 121, so that the reliability of coupling of the conductor layer 331 to the conductor layer 121 can be enhanced.

Further, in the transmitter 1 of the first embodiment, the negative end of the conductor layer 331 in the direction of the Z axis is positioned on a position towards the package 401 from the rigid substrate 100 in the direction perpendicular to the rigid substrate 100.

This allows the conductor layer 331 coupled to the signal electrode 4034 to be electrically coupled to the conductor layer 121 of the rigid substrate 100 without bending a portion of the flexible substrate 300, the portion having the conductor layer 331 coupled to the signal electrode 4034. This shortens the distance between the conductor layer 121 of the rigid substrate 100 coupled to the signal electrode 4034 and the package 401 along the direction of the X axis. The area on the rigid substrate 100 used for coupling the package 401 to the conductor layer 121 of the rigid substrate 100 can be reduced, which can achieve a compact transmitter 1, for example.

Figure 16:
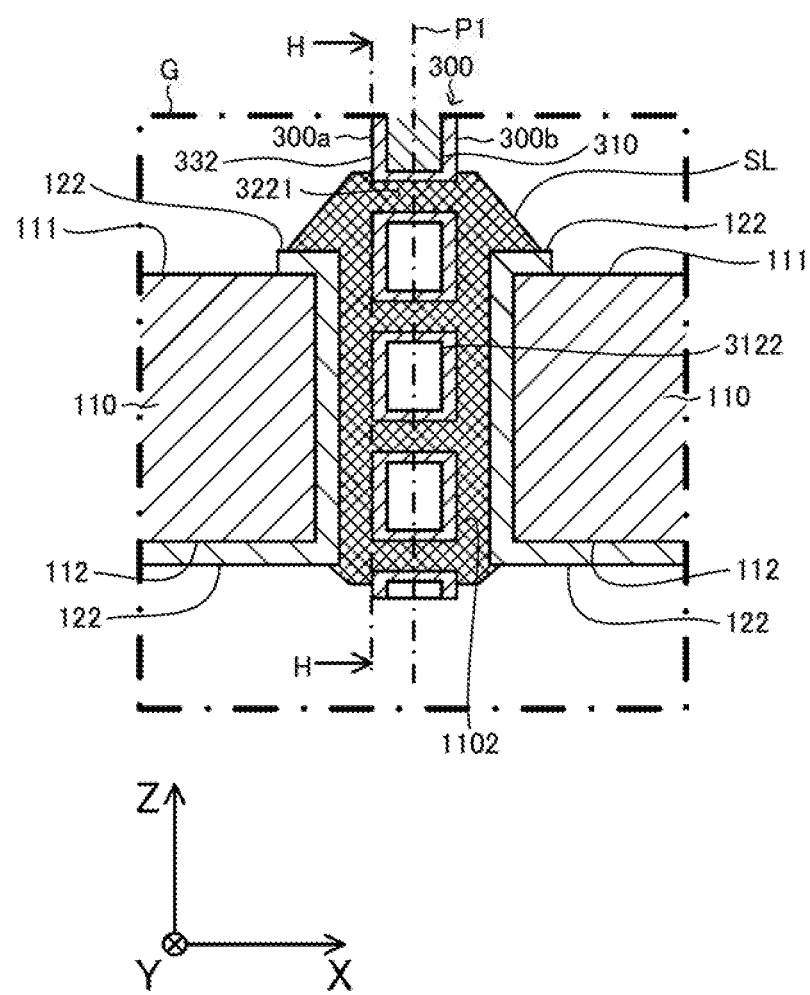
FIG. 16 is a diagram illustrating an example of a cross section of a transmitter according to a first modification to the first embodiment, the cross section corresponding to that of FIG. 13.

Alternatively, as illustrated in FIG. 16, the negative end of the flexible substrate 300 in the direction of the Z axis may be a hollow. In other words, the tip (i.e., tips of the protrusions 3122 and 3123) of the body 310 in the negative tip of the flexible substrate 300 in the direction of the Z axis may be disposed on the positive side of the Z axis from the negative tip of the conductor layer 332 in the direction of the Z axis.

First Modification to the First Embodiment

Next, description will now be made in relation to a transmitter according to a first modification to the first embodiment. The transmitter of the first modification is different from the transmitter 1 of the first embodiment in the point that the widths of the conductor layers of the flexible substrate are different from each other. Hereinafter, description will focus on the difference.

Figure 17:
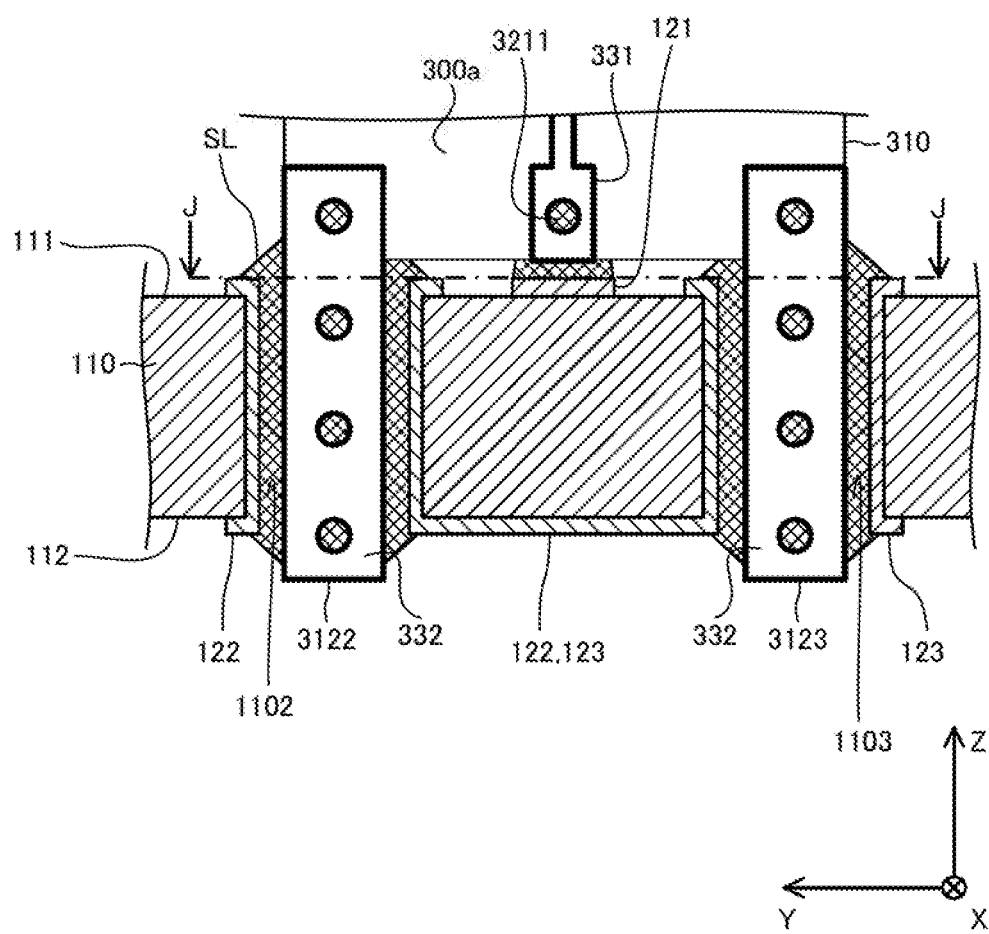
FIG. 17 is a diagram illustrating an example of a region of a transmitter according to the first modification to the first embodiment, the region corresponding to that of FIG. 14.
Figure 18:
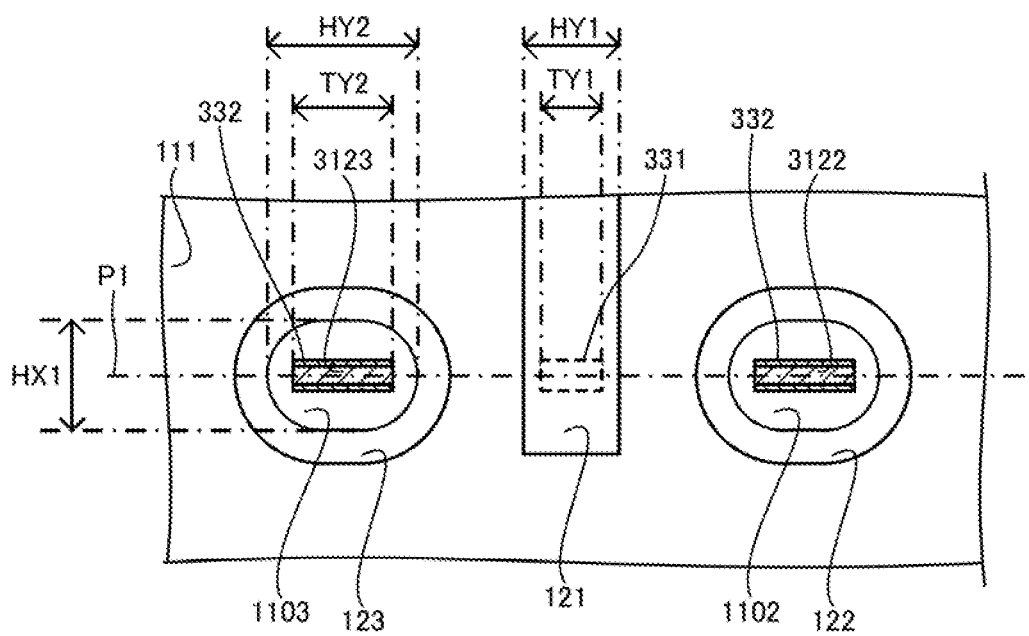
FIG. 18 is a diagram illustrating an example of a cross section of a transmitter of FIG. 17 cut by line J-J.

FIG. 17 illustrates the section of the transmitter 1 of the first modification to the first embodiment. FIG. 17 illustrates a region corresponding to the region illustrated in FIG. 14, which represents a section of the transmitter 1 of the first embodiment. FIG. 18 illustrates a section of the transmitter 1 cut by line J-J of FIG. 17, and omits illustration of soldering.

As illustrated in FIGS. 17 and 18, the negative end of the conductor layer 331 in the direction of the Z axis has a length TY1 along the Y axis being shorter than a length TY2 of the protrusions 3122 and 3123 along the Y axis.

The length TY1 of the negative end of the conductive layer 331 in the direction of the Z axis of along the Y axis may be referred to as the width of the negative end of the conductor layer 331 in the direction of the Z axis. Likewise, the length TY2 of the protrusions 3122 and 3123 along the Y axis may be referred to as the width of the protrusions 3122 and 3123.

As illustrated in FIGS. 17 and 18, the conductor layer 121 has a length HY1 along the Y axis being shorter than a length HY2 of the through-holes 1102 and 1103 along the Y axis. The through-holes 1102 and 1103 have a length HY2 along the Y axis being longer than the length HX1 of the through-holes 1102 and 1103 along the X axis.

The length HY2 of the through-holes 1102 and 1103 along the Y axis is an example of a length of an opening of the through-holes 1102 and 1103 in a first direction along a plane P1 defined by the protrusions 3122 and 3123. The length HX1 of the through-holes 1102 and 1103 along the X axis is an example of a length of an opening of the through-holes 1102 and 1103 in a second direction perpendicular to a plane P1 defined by the protrusions 3122 and 3123.

As illustrated in FIG. 18, the sections of the XY plane of through-holes 1102 and 1103 of the first modification can be regarded as being in the shape of rounded rectangles. The openings of the through-holes 1102 and 1103 may be referred to as openings of the second through-hole terminals.

As described above, the negative end of the conductor layer 331 in the direction of the Z axis coupled to the signal electrode 4034 has a width smaller than that of the protrusions 3122 and 3123 covered with the conductor layer 332 coupled to the ground electrodes 4035 and 4036.

The capacitance between the conductor layer 331 and the conductor layers 332, 122, and 123 coupled to the ground electrodes 4035 and 4036 tends to be large. This may sometimes hinder the intrinsic impedance of the circuit of the rigid substrate 100 and the flexible substrate 300 from sufficiently approaching the target value (e.g., 50Ω), which results in that an RF (Radio Frequency) signal is easily reflected to increase electric power loss caused from inputting a signal from the rigid substrate 100 into the package 401.

In contrast to the above, the transmitter 1 of the first modification makes it possible to make the capacitance between the conductor layer 331 and the conductor layers 332, 122, and 123 coupled to the ground electrodes 4035 and 4036. Consequently, the intrinsic impedance of the circuit of the rigid substrate 100 and the flexible substrate 300 can sufficiently approach the target value (e.g., 50Ω), so that electric power loss caused from inputting a signal from the rigid substrate into the package 401 can be suppressed.

Besides, it is possible to increase the area of the conductive layer 332 which area is used to couple the conductor layer 332 to the conductor layers 122 and 123. In other words, it is possible to increase the area of the conductor layer 332 which area soldering SL adheres to, so that the reliability of coupling can be enhanced.

Second Modification to First Embodiment

Next, description will now be made in relation to a transmitter according to a second modification to the first embodiment. The transmitter of the second modification is different from the transmitter 1 of the first embodiment in installing fashion of the conductor layer coupled to the signal electrode between the flexible substrate and the rigid substrate. Hereinafter, description will focus on the difference.

Figure 19:
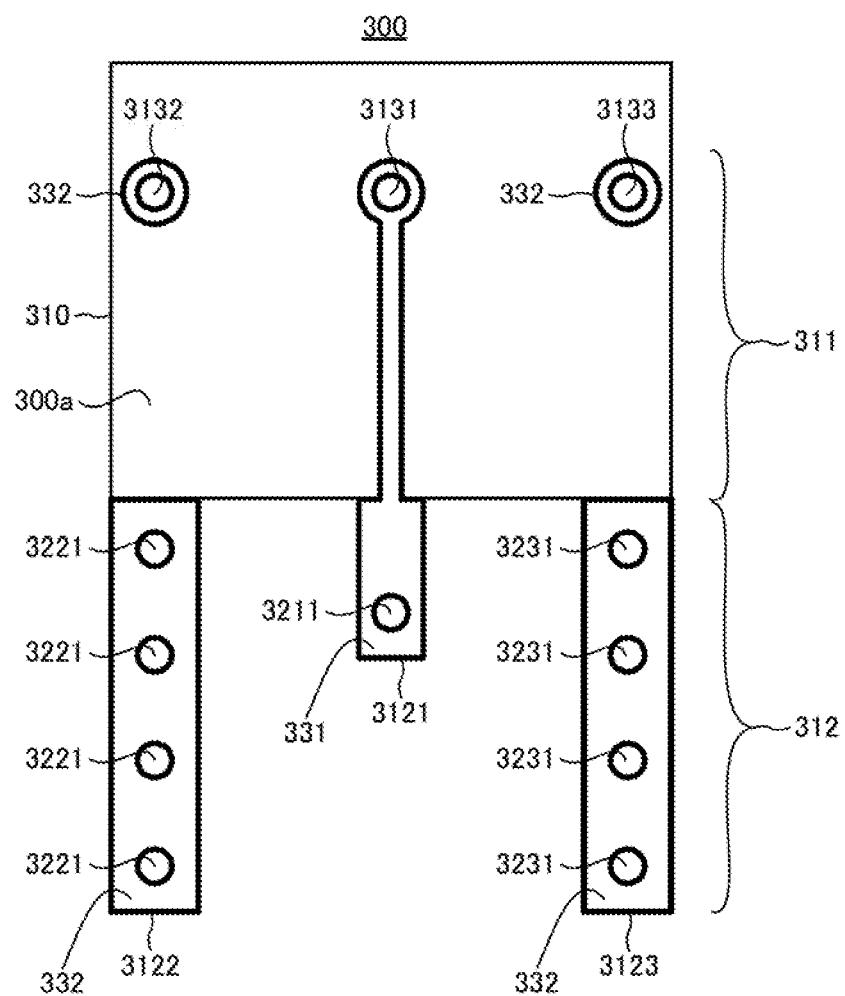
FIG. 19 is a diagram illustrating an example of a front view of a flexible substrate according to a second modification to the first embodiment.

FIG. 19 illustrates the front face of the flexible substrate 300 of the second modification. The flexible substrate 300 illustrated in FIG. 19 is in a state before being installed to the transmitter 1.

For example, as illustrated in FIG. 19, the protrusion group 312 of the second modification further includes a protrusion 3121 in addition to the two protrusions 3122 and 3123 included in the protrusion group 312 of the first modification. The protrusion 3121 extends from the center portion of the side along the Y axis on the negative end of the Z axis of the base 311 towards the negative direction of Z axis.

In other words, the length of the protrusion 3121 along the Y axis is shorter than the length of the side along the Y axis on the negative end of the base 311 in the direction of the Z axis. This means that the protrusion 3121 protrudes from a portion of the side on the negative end of the base 311 in the direction of the Z axis.

In the second modification, the protrusion 3121 is shorter than the protrusions 3122 and 3123 in the direction of Z axis.

The protrusion 3121 includes a though-hole 3211 at the negative end of the Z axis. The through-hole 3211 is an example of a second through-hole or a second hole.

As illustrated in FIG. 19, the conductor layer 331 is positioned in the vicinity of the protrusion 3121 and the through-hole 3131 of the base 311 on the surface 300a on the negative side of the flexible substrate 300 in the direction of X axis. In addition, on the surface 300a on the negative side of the flexible substrate 300 in the direction of X axis, the conductive layer 331 is positioned at a region connecting the protrusion 3121 to a portion of the base 311 in the vicinity of the through-hole 3131 on the surface 300a on the negative side of the flexible substrate 300 in the direction of X axis.

In addition, the conductor layer 331 is positioned on the protrusion 3121 on the surface 300b on the positive side of the flexible substrate 300 in the direction of the X axis. Furthermore, the conductor layer 331 is positioned on a wall of the body 310 that forms thereon the through hole 3211.

Figure 20:
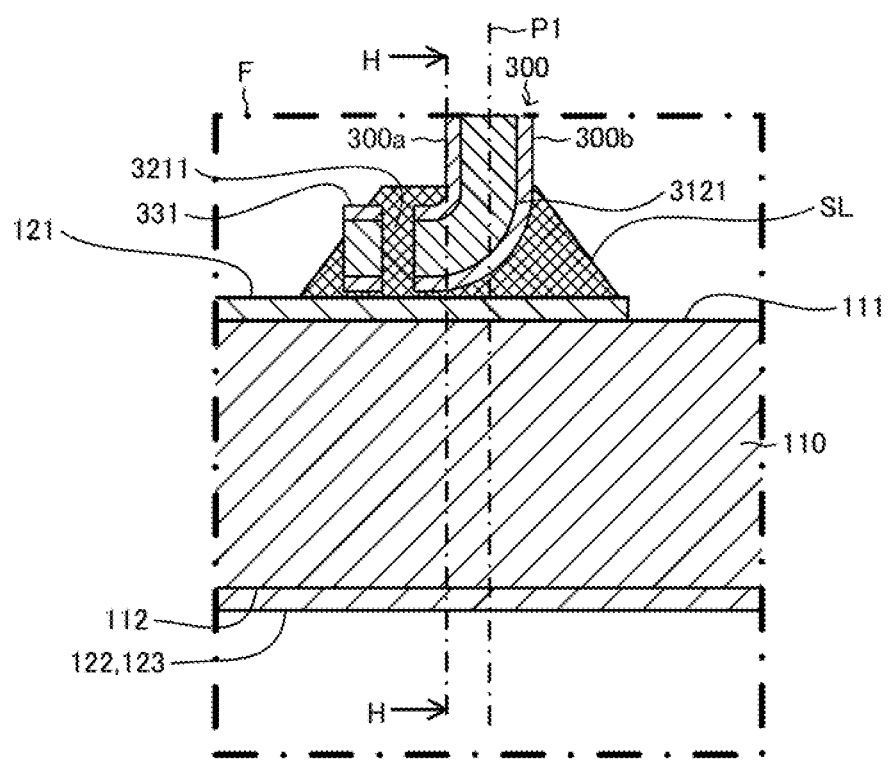
FIG. 20 is a diagram illustrating an example of a region of a transmitter according to the second modification to the first embodiment, the region corresponding to that of FIG. 12.
Figure 21:
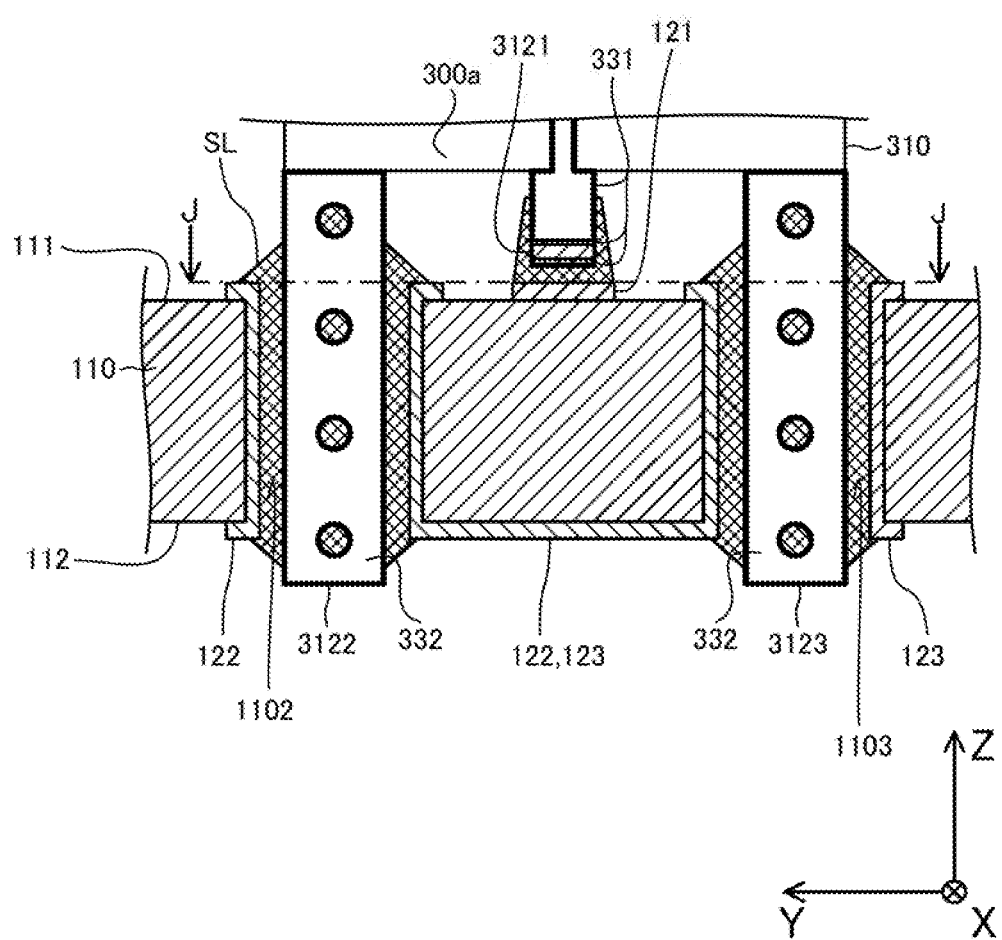
FIG. 21 is a diagram illustrating an example of a cross section of a transmitter of FIG. 20 cut by line H-H.
Figure 22:
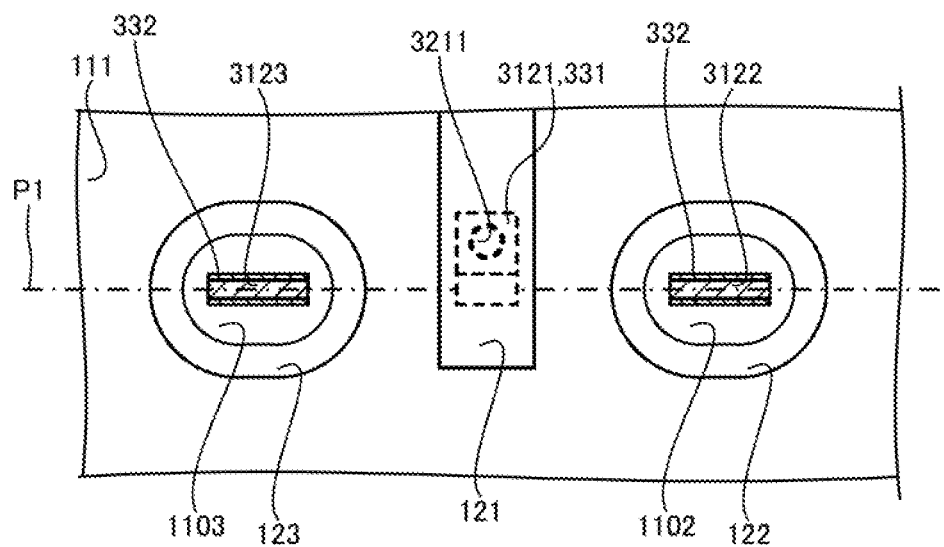
FIG. 22 is a diagram illustrating an example of a cross section of a transmitter of FIG. 21 cut by line J-J.

FIG. 20 illustrates a section of the transmitter 1 according to the second modification to the first embodiment. FIG. 20 illustrates a region corresponding to that the section of the transmitter 1 of FIG. 12 of the first embodiment. Specifically, the section of the FIG. 21 is cut by line H-H of FIG. 20. FIG. 22 illustrates a section of the transmitter 1 cut by line J-J of FIG. 21. FIG. 22 omits illustration of soldering.

As illustrated in FIGS. 20-22, the conductor layer 331 of the flexible substrate 300 has the protrusion 3121 whose tip bending along the surface 111 on the positive side of the rigid substrate 100 in the direction of the Z axis. The through-hole 3211 is positioned at a portion of the tip of the protrusion 3121, which portion is parallel to the surface 111 on the positive side of the rigid substrate 100 in the direction of the Z axis.

Under states where the negative end of the conductor layer 331 in the direction of the Z axis is positioned at a position towards the positive direction of the Z axis from the conductor layer 121 of the rigid substrate 100, the conductor layer 331 positioned at the tip of the protrusion 3121 is electrically coupled to the conductor layer 121 with soldering SL. This means that the negative end of the Z axis of the conductor layer 331 is positioned at a position towards the package 401 from the rigid substrate 100 in the direction perpendicular to the rigid substrate 100. The conductor layer 331 of the flexible substrate 300 may be electrically coupled to the conductor layer 121 with soldering SL under a state where the negative end of the conductive layer 331 in the direction of the Z axis is in contact with the conductor layer 121 of the rigid substrate 100.

In the second modification, soldering SL filling the through-hole 3211 and covering at least part of the conductor layer 331 outside the through-hole 3211 electrically couples the conductor layer 331 to the conductor layer 121. This means that the conductor layer 331 is electrically coupled by the conductor layer 121 by embedding the through-hole 3211 in soldering SL.

As described above, in the conductor layer 331 covering the protrusion 3121 of the second modification, the tip of the protrusion 3121 bends along the surface 111 on the positive side of the rigid substrate 100 of the Z axis. Besides, the through-hole 3211 of the protrusion 3121 is positioned at a portion of the tip of the protrusion 3121, which portion is parallel with the surface 111.

This fills the through-hole 3211 with soldering SL and covers at least part of the surface 300a of the protrusion 3121 on the opposite side to the rigid substrate 100 with soldering SL, so that the soldering SL prevents the conductor layer 331 from peeling from the conductor layer 121. Consequently, it is possible to enhance the reliability of coupling between the conductive layer 331 coupled to the signal electrode 4034 and the conductive layer 121.

Furthermore, in the second modification, the conductor layer 121 of the rigid substrate 100 extends along the direction perpendicular to the plane P1 along the side wall 401a of the package 401 on the surface 111 on the positive side of the rigid substrate 100 in the direction of the Z axis.

This means that the conductor layer 121 extends in the same direction as the tip of the protrusion 3121. Consequently, the area of a conductor layer for coupling the conductor layer 331 covering the protrusion 3121 to the conductor layer 121 can be increased. This means that the area of the conductor layer that the soldering SL adheres to can be increased, so that the reliability of coupling of the conductor layer 331 coupled to the signal electrode 4034 to the conductor layer 121 can be enhanced.

Alternatively, the light modulator 40 of the above embodiment and modifications may generate a modulated light signal in a multi-value modulation scheme using multiple (e.g., two or four) Mach-Zehnder interferometers. In this alternative, the multiple Mach-Zehnder interferometers may be arranged in parallel. Further alternatively, the light modulator 40 may generate a modulated light signal in a polarization multiplexing scheme using multiple (e.g., two or four) Mach-Zehnder interferometers. In this alternative, the number of terminals of the flexible substrate 300 and the number of through-holes of the rigid substrate 100 may be varied with the number of driving signals input into the light modulator 40.

As an alternative to the above embodiment and modifications, the transmitter 1 may include another rigid substrate in place of the flexible substrate 300 and couples the terminals of the rigid substrate 100 and the terminals of the package 401 via the other rigid substrate.

In place of the soldering of the above embodiment and modifications, the conductor layers may be coupled to each other by material (e.g., conductive adhesive) different from soldering.

The above technique to couple a terminal of the package 401 to a terminal of the rigid substrate 100 may be applied to coupling of a terminal of the package 401 to a terminal of the rigid substrate 100 for a case where a driving circuit 20 is contained in the package.

The technique to couple a terminal of the package 401 to the terminals of the rigid substrate 100 may be applied, in place of the transmitter 1, to a receiver that receives a light signal or to a light relay that relays a light signal. For example, a light receiver includes a signal processor that carries out a process of receiving a light signal; and the light relay includes a first signal processor that carries out a process of transmitting a light signal and a second signal processor that carries out a process of receiving a light signal. Further alternatively, the technique to couple terminals of the package 401 to the terminals of the rigid substrate 100 may be applied to a device that processes a signal except for a light signal.

It is possible to reduce the area of a region used to couple a terminal of the package to the terminals of the rigid substrate.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:
1. A light communication device comprising:
a signal processor that transmits or receives a light signal and includes a signal electrode and a ground electrode;
a rigid substrate that includes a first terminal arranged on a surface thereof and a second terminal having a first hole opened at the surface;
a package that is disposed at the surface of the rigid substrate, that contains the signal processor, and that includes a third terminal and a fourth terminal being provided on a side wall thereof and being electrically coupled to the signal electrode and the ground electrode of the signal processor, respectively; and
a flexible substrate that is arranged along the side wall such that a distal end thereof with respect to the rigid substrate is positioned near to the package and a proximal end thereof with respect to the rigid substrate is positioned near to the rigid substrate, and that includes a fifth terminal and a sixth terminal being provided on the proximal end and being electrically coupled to the third terminal and the fourth terminal, respectively, wherein
the fifth terminal is electrically coupled to the first terminal on the surface, and
the sixth terminal, with being placed into the first hole, is electrically coupled to the second terminal.
2. The light communication device according to claim 1, wherein
the first hole is positioned on a plane extending along the side wall.
3. The light communication device according to claim 1, wherein
the fifth terminal has a width smaller than that of the sixth terminal.
4. The light communication device according to claim 1, wherein
the fifth terminal includes a second hole; and
the fifth terminal is electrically coupled to the first terminal on the surface with soldering filling the second hole and covering at least part of the fifth terminal outside the second hole.
5. The light communication device according to claim 4, wherein
the fifth terminal has a tip positioned at a position towards the package from the rigid substrate in a direction perpendicular to the rigid substrate.

6. The light communication device according to claim 4, wherein
the fifth terminal has a tip bending along the surface, and
the second hole is positioned on a portion of the tip, the portion being parallel with the surface.

7. The light communication device according to claim 6, wherein
the first terminal extends on the surface in a direction perpendicular to a plane along the side wall.

8. The light communication device according to claim 1, wherein
the signal processor is a modulator that modulates light using an electric signal input from the rigid substrate.

9. A light module comprising:
a signal processor that transmits or receives a light signal and includes a signal electrode and a ground electrode;
a rigid substrate that includes a first terminal arranged on a surface thereof and a second terminal having a first hole opened at the surface;
a package that is disposed at the surface of the rigid substrate, that contains the signal processor, and that includes a third terminal and a fourth terminal being provided on a side wall thereof and being electrically coupled to the signal electrode and the ground electrode of the signal processor, respectively; and
a flexible substrate that is arranged along the side wall such that a distal end thereof with respect to the rigid substrate is positioned near to the package and a proximal end thereof with respect to the rigid substrate is positioned near to the rigid substrate, and that includes a fifth terminal and a sixth terminal being provided on the proximal end and being electrically coupled to the third terminal and the fourth terminal, respectively, wherein
the fifth terminal is electrically coupled to the first terminal on the surface, and
the sixth terminal, with being placed into the first hole, is electrically coupled to the second terminal.

10. The light module according to claim 9, wherein
the first hole is positioned on a plane extending along the side wall.

11. The light module according to claim 9, wherein
the fifth terminal has a width smaller than that of the sixth terminal.

12. The light module according to claim 9, wherein
the fifth terminal includes a second hole; and
the fifth terminal is electrically coupled to the first terminal on the surface with soldering filling the second hole and covering at least part of the fifth terminal outside the second hole.

13. The light module according to claim 12, wherein
the fifth terminal has a tip positioned at a position towards the package from the rigid substrate in a direction perpendicular to the rigid substrate.

14. The light module according to claim 12, wherein
the fifth terminal has a tip bending along the surface, and
the second hole is positioned on a portion of the tip, the portion being parallel with the surface.

15. The light module according to claim 14, wherein
the first terminal extends on the surface in a direction perpendicular to a plane along the side wall.

16. The light module according to claim 9, wherein
the signal processor is a modulator that modulates light using an electric signal input from the rigid substrate.

17. A method for electrically coupling a rigid substrate to a signal processor that is contained in a package disposed at a surface of the rigid substrate and that transmits or receives a light signal, the method comprising:
electrically coupling, on the surface, a fifth terminal to a first terminal disposed on the surface, the fifth terminal being included in a flexible substrate and being electrically coupled to a third terminal, the flexible substrate being arranged along a side wall of the package such that a distal end thereof with respect to the rigid substrate is positioned near to the package and a proximal end thereof with respect to the rigid substrate is positioned near to the rigid substrate, the side wall comprising the third terminal and a fourth terminal electrically coupled to a signal electrode and a ground electrode of the signal processor, respectively; and
electrically coupling a sixth terminal, with being placed into a first hole, to a second terminal, the sixth terminal being included in the flexible substrate and being electrically coupled to the fourth terminal, the second terminal being provided on the rigid substrate and including the first hole opened at the surface.

* * * * *